(12) United States Patent
Faulkner et al.

(10) Patent No.: US 7,382,021 B2
(45) Date of Patent: Jun. 3, 2008

(54) INSULATED GATE FIELD-EFFECT TRANSISTOR HAVING III-VI SOURCE/DRAIN LAYER(S)

(75) Inventors: Carl Faulkner, Belmont, CA (US); Daniel J. Connelly, San Francisco, CA (US); Daniel E. Grupp, Palo Alto, CA (US)

(73) Assignee: Acorn Technologies, Inc., Pacific Palisades, CA (US)

( * ) Notice: Subject to any disclaimer, the term of this patent is extended or adjusted under 35 U.S.C. 154(b) by 257 days.

(21) Appl. No.: 11/010,048

(22) Filed: Dec. 9, 2004

(65) Prior Publication Data

US 2005/0104137 A1    May 19, 2005

Related U.S. Application Data

(60) Continuation-in-part of application No. 10/832,576, filed on Apr. 26, 2004, now Pat. No. 6,891,234, application No. 11/010,048, filed on Dec. 9, 2004, and a continuation-in-part of application No. 10/217,758, filed on Aug. 12, 2002, now Pat. No. 7,084,423, and a continuation-in-part of application No. 10/754,966, filed on Jan. 9, 2004, now Pat. No. 7,112,478, which is a division of application No. 10/342,576, filed on Jan. 14, 2003, now Pat. No. 6,833,556, which is a continuation-in-part of application No. 10/217,758, filed on Aug. 12, 2002, now Pat. No. 7,084,423.

(60) Provisional application No. 60/535,082, filed on Jan. 7, 2004.

(51) Int. Cl.
    *H01L 31/119* (2006.01)

(52) U.S. Cl. ............. 257/344; 257/407; 257/408; 257/412; 257/19; 257/E21.094; 257/E21.104; 257/E21.372; 257/E21.411; 257/E21.416; 438/603

(58) Field of Classification Search ........ 257/347–354, 257/344, 408, 412, E21.094, E21.104, E21.372, 257/E21.411, E21.416; 438/603
See application file for complete search history.

(56) References Cited

U.S. PATENT DOCUMENTS

| | | | |
|---|---|---|---|
| 6,064,082 A * | 5/2000 | Kawai et al. | 257/192 |
| 6,207,976 B1 * | 3/2001 | Takahashi et al. | 257/192 |
| 6,339,232 B1 * | 1/2002 | Takagi | 257/192 |
| 2003/0094637 A1 * | 5/2003 | Awano | 257/288 |

* cited by examiner

*Primary Examiner*—Wai-Sing Louie
*Assistant Examiner*—Marc Armand
(74) *Attorney, Agent, or Firm*—Sonnenschein, Nath & Rosenthal LLP (57) ABSTRACT

A transistor includes one or more channel taps containing a stack consisting at least in part of a semiconductor an interfacial III-VI layered compound and a conductor. The III-VI compound consists primarily of atoms from Groups IIIA-B and from Group VIA of the Periodic Table of the Elements in an approximate 1:1 ratio. These materials may be formed as layers of covalently bonded elements from Groups IIIA-B and covalently bonded Group VIA elements, adjacent and respective planes of which may be bonded by Van der Waals forces (e.g., to form a single bilayer consisting of a single plane of atoms from Groups IIIA-B and a single plane of Group VIA atoms). One particular III-VI material from which the interfacial layer is made, especially for p-channel transistors, is GaSe. Other III-VI compounds, whether pure compounds or alloys of pure compounds, may also be used.

19 Claims, 2 Drawing Sheets

INSULATED GATE FIELD-EFFECT TRANSISTOR HAVING III-VI SOURCE/DRAIN LAYER(S)

RELATED APPLICATIONS

The present application is a continuation-in-part of the following U.S. patent applications:

1. Ser. No. 10/832,576, filed Apr. 26, 2004 now U.S. Pat. No. 6,891,234, entitled TRANSISTOR WITH WORKFUNCTION INDUCED CHARGE LAYER, which claims priority from U.S. Provisional Patent Application 60/535,082, filed Jan. 7, 2004;
2. Ser. No. 10/217,758, filed Aug. 12, 2002 now U.S. Pat. No. 7,084,423, entitled METHOD FOR DEPINNING THE FERMI LEVEL OF A SEMICONDUCTOR AT AN ELECTRICAL JUNCTION AND DEVICES INCORPORATING SUCH JUNCTIONS; and
3. Ser. No. 10/754,966, filed Jan. 9, 2004 now U.S. Pat. No. 7,112,478, entitled INSULATED GATE FIELD EFFECT TRANSISTOR HAVING PASSIVATED SCHOTTKY BARRIERS TO THE CHANNEL, which is a divisional of U.S. patent application Ser. No. 10/342,576, filed Jan. 14, 2003 now U.S. Pat. No. 6,833,556, entitled INSULATED GATE FIELD EFFECT TRANSISTOR HAVING PASSIVATED SCHOTTKY BARRIERS TO THE CHANNEL, which is a continuation-in-part of U.S. patent application Ser. No. 10/217,758 filed Aug. 12, 2002 now U.S. Pat. No. 7,084,423;

all of which are assigned to the same assignee as the present application and are incorporated herein by references in their respective entireties.

FIELD OF THE INVENTION

The present invention relates generally to a process for fabricating a transistor, and in particular a field effect transistor (FET), with one or more source(s) and/or drain(s) formed with a film of material of the "III-VI" class between a conductor and a semiconductor forming a channel region.

BACKGROUND

One of the most basic electrical junctions used in modern electronic devices is the conductor-semiconductor junction. In some cases, depending on the materials used, the junction may be ohmic in nature (i.e., the junction may have negligible resistance regardless of the direction of current flow). However in other cases the junction is inherently rectifying; that is, the junction tends to conduct current in one direction more favorably than in the other direction.

By 1938, Schottky had developed a theoretical explanation for such rectification; explaining that a barrier in electrical potentials at the surface of contact between the conductor and the semiconductor was responsible. In order for electrons or holes to pass between the conductor and the semiconductor, the charge carriers had to overcome this "Schottky barrier". The height of the barrier is determined by the difference in potentials between the carriers in the metal and those at the conduction band states of minimum energy (relevant to electrons) or valence band states of maximum energy (relevant to holes) of the semiconductor.

Metal/semiconductor junctions are fundamental components of field-effect transistors (FETs). With a FET device in the "on" state (in which charge is induced in a channel region by a gate electrode), carriers must relatively freely travel from one or more source(s), through the channel, and into one or more drains, where whether a given channel tap is better identified as a "source" or as a "drain" depends on the relative potential applied to the channel tap. Two types of channel taps are commonly used: "doped" semiconductor regions and metals.

With a doped source or drain, primarily substitutional impurities (dopants) yield a local reservoir of charge carriers (typically electrons for an n-channel transistor and holes for a p-channel transistor). To connect the transistor to other elements within the circuit, or to external connections of the circuit, metal is placed in electrical contact with the impurity-rich region. The critical parameter in a doped source or drain is how effectively the carriers can be exchanged with the reservoir (electrons for an n-type reservoir or holes for a p-type reservoir). A variety of junction characteristics contribute to a free exchange of these carriers, including:

1. A low Schottky barrier height due to an effective metal workfunction that is sufficiently low (for an n-type reservoir) or sufficiently high (for a p-type reservoir).
2. A high electric field at the interface, thinning the Schottky barrier and facilitating the tunneling of carriers through it. For example, higher concentrations of ionized impurities in the semiconductor near the metal/semiconductor interface tend to result in higher electric fields at that interface.
3. A shift in the effective band edges of the semiconductor, for example by "band gap narrowing" due to high concentrations of ionized impurities.
4. An increase in the rate of carrier generation/recombination processes in the vicinity of the barrier, facilitating the exchange of electrons and holes there, contributing to the flow of carriers between the contact and the channel when the channel is "on".

Metal or "Schottky" channel taps do not use impurity-rich regions between the contact and the channel(s), instead placing a metal conductor in direct contact with the region in which the channel is formed. The requirements on the Schottky barrier height at Schottky channel taps tend to be stricter than those for doped channel taps. There are several reasons that Schottky channel taps have stricter requirements. One is that Schottky channel taps tend to have a smaller metal/semiconductor interface area over which carriers can cross the interface; carriers must cross a Schottky contact in close proximity to the channel, where the channel is typically only a few nanometers thick, while with a doped channel tap carriers may be able to spread over a much broader area, traveling through the conductive impurity-rich region before or after crossing the metal/semiconductor boundary. Another reason is that a higher electric field at the contact (item 2 in the preceding list), impurity-induced band edge shifts (item 3 in the preceding list), and enhanced generation/recombination (item 4 in the preceding list) are less available to Schottky channel taps. Regions of high concentrations of ionized impurities (dopants) are unavailable, and substantially enhanced generation/recombination processes would increase the "off-state" leakage current.

So for both types of source or drain, doped or Schottky, but especially Schottky, reducing the Schottky barrier height is beneficial for the efficient transfer of current between the source(s) and drain(s) when the channel is in the "on" state. The most straightforward approach to reducing the Schottky barrier height is to choose a metal with a lower (for an n-channel transistor) or higher (for a p-channel transistor) workfunction. However, metal/semiconductor interactions reduce the efficacy of this approach.

The Schottky barrier is affected by a chemical and/or electrical interaction between the metal and the semiconductor with which it is in contact. The result of the interaction may be a charge dipole layer at the interface, which is affected by the potential energy of carriers in the metal, the energy levels of the available semiconductor conduction or valence band states, and possibly energy levels induced in the semiconductor gap due to proximity with the metal. The charge dipole may be "extrinsic", due to imperfections in the crystal structure at or in the vicinity of the interface, or "intrinsic", a fundamental consequence of the proximity and/or local bonding of the different materials. This dipole tends to have a polarity and strength such that it causes the Fermi level of the metal to be roughly aligned with an energy level in the semiconductor (at the metal/semiconductor interface) associated with the "forbidden gap" of the semiconductor: an energy at which there are essentially no "free" electron or hole states. With this alignment, there are Schottky barriers to the conduction and valence bands. Among the approaches to describing this "intrinsic" interaction are those of R. Tung, *Phys. Rev. B*, vol. 45, no. 23, pp. 13509-13523 (1992), and W. Mönch, *Surface Science*, vol. 300, pp. 928-944 (1994).

In either case, an approach to reducing the intrinsic interaction (as described by Grupp and Connelly in the above-cited patent applications) is to impose an interfacial layer between the semiconductor forming the channel and the metal. If this material can be formed with a low defect density, minimizing "extrinsic" states, while reducing the intrinsic states arising from the proximity of the metal to the semiconductor, the magnitude of the charge dipole can be reduced, allowing for a reduced or even eliminated Schottky barrier between the metal and the semiconductor in the channel region. The key is that the material be sufficiently thin so that, even if there is a Schottky barrier between the metal and the interfacial layer, free carriers of the appropriate type (electrons or holes) can be readily exchanged between the channel region semiconductor and the metal. The carriers may, for example, tunnel through the barrier associated with the thin interfacial layer.

Thus, Grupp and Connelly demonstrated that controlling or adjusting the barrier height of a metal/semiconductor junction could produce electrical devices of desired characteristics. For example, using the methods described in the above-cited patent applications one can tune MOSFETs to address issues of on-resistance and off-state leakage currents, as well as control short-channel effects. However, certain challenges must be overcome to achieve these advantages; among them, the ability to control the thickness of the interface layer between the metal and the semiconductor.

Controlling the thickness of interfacial layers or films of the types described in the above-cited patent applications (e.g., materials which, in their bulk form, are insulators, such as silicon nitride, $Si_3N_4$, or oxides of semiconductors, such as $SiO_2$, or of metals, such as $ZrO_2$) may not be easy. The film needs to be sufficiently thin that the tunneling of free electrons and holes through the resulting potential barrier is sufficiently probable that the peak available current in the device is not substantially diminished. Achievement of this needed tunneling probability, while maintaining the needed reduction in the metal/semiconductor interaction, may require near-monolayer control of the interfacial layer thickness.

Additionally, the present inventors have recognized that the interfacial material's interface with the channel region semiconductor should have a low defect density, avoiding "extrinsic" states and/or other deleterious effects associated with a high defect density. And, to facilitate the tunneling of free carriers through the interfacial layer, the material used for that layer should have sufficiently small potential barriers at the conduction and valence band, combined with suitably low "tunneling effective masses" for electrons and holes, where the "tunneling effective mass" describes how readily, for a given potential barrier height, carriers tunnel. Conversely, since material with weaker intrinsic interactions with metals tend to have wider band gaps, an interfacial layer in a preferred embodiment will not in general be one with a minimum barrier height to the conduction or valence band of the semiconductor with which it is in contact. Finally, if the interfacial layer does tend to "pin" the Fermi level towards a given value (a value at which the dipole at the interface between the interfacial layer and the metal becomes small), that value should preferably be closer to the band edge associated with the channel carrier (the conduction band for n-channel transistors, the valence band for p-channel transistors), of the material forming the channel region, resulting in a reduced tendency for the "pinning" to increase the Schottky barrier height between the metal and the channel region semiconductor for the carrier type of the channel.

SUMMARY OF THE INVENTION

In the above-cited U.S. patent applications Ser. Nos. 10/832,576 and 10/754,966, Grupp and Connelly describe an insulated gate field-effect transistor having passivated Schottky barriers to the channel, in which an "interface layer" is imposed between the channel material and the source/drain material of a FET. The interface layer is used to "depin" the Fermi level of the metal from deep within the gap of a semiconductor in the vicinity of the contact, reducing the Schottky barrier for a metal of an appropriate workfunction (relatively low for an n-channel FET, and relatively high for a p-channel FET). By depinning the Fermi level, the present inventors mean a condition wherein, to a substantial degree, dangling bonds that may otherwise be present at the semiconductor surface have been terminated, and the effects of a charge dipole associated with metal/semiconductor interactions have been overcome, or at least reduced, by displacing the semiconductor a sufficient distance from the metal.

In one embodiment of the present invention, to reduce or eliminate the Schottky barrier between a source or drain and the channel of a transistor (e.g., a FET or MOSFET), an interfacial layer of a "III-VI" compound is used. Such an interfacial layer has a reduced dipole interaction, relative to the semiconductor forming the channel region (for example, Si), with one or more metals of a workfunction appropriate for the type of the transistor (a relatively low workfunction for an n-channel transistor, or a relatively high workfunction for a p-channel transistor), The "III-VI" compound consists primarily of atoms from Groups IIIA-B and from Group VIA of the Periodic Table of the Elements in an approximate 1:1 ratio. Elements from Groups IIIA-B include B, Al, Sc, Ga, Y, In, La, Tl, Ac, and Uut. Group VIA elements include O, S, Se, Te, Po, and Uuh. These materials may be formed as layers of covalently bonded elements from Groups IIIA-B and covalently bonded Group VIA elements, adjacent and respective planes of which may be bonded by Van der Waals forces (e.g., to form a single bilayer consisting of a single plane of atoms from Groups III-B and a single plane of Group VIA atoms). One particular III-VI material from which the interfacial layer is made, especially for p-channel transistors, is GaSe. Other III-VI compounds, whether pure compounds or alloys of pure compounds, may also be used.

In a further embodiment of the present invention, a transistor having a gate and one or more channel taps each containing a stack consisting at least in part of a semiconductor channel, an interfacial III-VI layered compound consisting of one or more elements from Groups IIIA-B and one or more Group VIA elements in approximately a 1:1 ratio of Groups IIIA-B to Group VIA stoichiometry, and a conductor is provided. The semiconductor channel may be any one of: Si, Ge, C; an alloy of Ge and Si; an alloy of Si and C; an alloy of Ge and C; or an alloy of Ge, Si, and C. The semiconductor may be strained or unstrained. An example of a strained semiconductor is Si under tensile or compressive strain for the purpose of electron and/or hole mobility enhancement. Preferably, a surface on which the interfacial III-VI layered compound is formed is primarily a {111} surface. In such a case, the interfacial III-VI layered compound may be approximately epitaxially aligned with the underlying {111} semiconductor.

The interfacial III-VI layered compound may be primarily a bilayer made up of a single plane of primarily elements from Groups IIIA-B and a single plane of primarily Group VIA elements. In one particular embodiment the interfacial III-VI layered compound is primarily GaSe.

The conductor may be a metal, that in various embodiments may have a workfunction, associated with one or more surfaces, of greater than an ionization potential of the semiconductor channel in a vicinity of the channel tap, or less than an electron affinity of the semiconductor channel in a vicinity of the channel tap.

To fabricate the present transistor, in accordance with one embodiment of the present invention, one or more {111} surfaces of the semiconductor channel region are exposed and then annealed at a temperature sufficient to generate a 7×7 reconstruction of the {111} surfaces. Thereafter, without exposing the wafer on which the transistor is fabricated to atmosphere, an ultra-thin layer of the III-VI layered compound is deposited on the {111} surfaces so as to be epitaxially aligned therewith. Finally the conductor is deposited in contact with the III-VI layered compound to create the channel tap. The {111} surfaces may be exposed using, for example: a tetramethylammonium hydroxide (TMAH) solution, a potassium hydroxide (KOH) solution, or a solution consisting at least in part of ethylenediamine (1,2-diaminoethane hydrate) $NH_2(CH_2.CH_2)NH2$, and pyrocatechol (o-dihydroxybenzene) $C_6H_4(OH)_2$.

BRIEF DESCRIPTION OF THE DRAWINGS

The present invention is illustrated by way of example, and not by way of limitation, in the figures of the accompanying drawings.

DETAILED DESCRIPTION

Described herein are various embodiments of the present invention, including a transistor having one or more channel taps (source(s) and/or drain(s)) containing a stack consisting at least in part of a semiconductor, an interfacial III-VI layered compound, for example GaSe; and a conductor, which may be metal. The III-VI compound may be formed on a {111} surface of the semiconductor, for example Si or an alloy of Si, forming the channel. It may be epitaxially formed as a bilayer, consisting of a single layer of element(s) from Groups IIIA-B, such as Ga, and a single layer of Group VI elements, such as Se. The {111} source and/or drain surface(s) may be of a separate plane than the channel plane, possibly exposed by a selective etch.

For purposes of the present invention, a III-VI compound includes one or more element(s) from Groups IIIA-B (e.g., B, Al, Sc, Ga, Y, In, La, Tl, Ac, and Uut) and one or more Group VIA elements (e.g., O, S, Se, Te, Po, Uuh) in approximately a 1:1 ratio of Groups IIIA-B to Group VIA stoichiometry. There may be an excess of element(s) from Groups IIIA-B and/or of Group VIA element(s) at one or both surfaces of the compound. For example, a GaSe layer on Si may consist of a monolayer of Ga capped with multiple layers of Se. This can be considered a bilayer of GaSe capped with Se. Alternately or additionally, there may be an excess of Ga at the Si surface. The key characteristic is that through some region, the IIIA-B and IVA elements are in an approximate 1:1 ratio.

The remaining discussion will present several embodiments of this invention, but this discussion is not meant to limit the scope of the invention. By studying the present disclosure others of ordinary skill in the art may recognize equivalent procedures, materials or structures that can be substituted for those described herein to achieve the same effect. The reader is advised that the use of such equivalents is deemed to be within the scope of the present invention. Prior to beginning this discussion in detail it is helpful to introduce the following definitions:

1. bandgap: In a semiconductor, one of the following: (1) The difference in energy between the lowest energy states in the conduction band(s), and the highest energy states in the valence band(s), typically measured in "electron volts". (2) The potential difference between the lowest energy states in the conduction band(s), and the highest energy states in the valence band(s), typically measured in "volts". (3) The range of potentials and/or energies between those associated with the lowest energy states in the conduction band(s) and the highest energy state in the valence band(s).
2. channel: The region of charge in a FET that is largely controlled by the potential of the gate electrode and is electrically connected to two or more channel taps.
3. channel tap: A connection between a metal conducting material and one or more channels of a FET. "Conventional" FETs have two channel taps, a "source" and a "drain". A channel tap can also be generically referred to as a "source/drain" or "S/D".
4. conductor/conducting material: Either a metal or a semiconductor.
5. conduction band: In a semiconductor or insulator, a band of states with energy above the Fermi energy of the semiconductor in the absence of impurities in equilibrium. See, also, "valence band".
6. doped channel tap: A channel tap where rectification between the region of the channel and the metal contact is determined primarily by the doping in the region of the contact. If the doping in the vicinity of the contact is primarily donor ions, electrons are relatively more readily exchanged with the channel region than are holes, and the channel tap will be typically suitable for use in n-channel FETs. If the doping in the vicinity of the contact is primarily acceptor ions, holes are relatively more readily exchanged with the channel region than are electrons, and the channel tap will be typically more suitable for use in p-channel FETs. The interface between the metal and the semiconductor is then typically such that it provides a relatively low resistance exchange of carriers of the channel type, with or without a comparably free exchange of the opposite carrier type.

7. doped source/drain (S/D) FET: A FET where the source and drain are doped channel taps, with the doping of the source determining the device polarity. Variants include a "doped source FET", with a doped source, but not necessarily doped drain. Another variant is a "doped drain FET", with a doped drain, but not necessarily a doped source.

8. drain: Typically the channel tap(s) that act as a sink for carriers from the channel. Thus it tends to be held at the highest (n-channel FET) or lowest (p-channel FET) electrostatic potential of all of the channel taps.

9. effective workfunction: The value experimentally extracted for the workfunction of a metal in contact with another material, under the assumption the metal at the interface is an equipotential surface defined by an effective workfunction. For a metal in contact with an insulator, capacitance versus voltage of a metal-insulator-semiconductor capacitor can be analyzed for a variety of insulator thicknesses, the effective metal workfunction, and the effective fixed charge density of the insulator/semiconductor interface, can be determined. See, for example, Section 6.2 of D. Schroeder, *Semiconductor Material and Device Characterization* $2^{nd}$ ed. (1998). In the absence of data using the actual insulator associated with the metal/insulator interface in question, metal-$SiO_2$-semiconductor structures can be used. Data from metal-insulator-Si test structures can be used, if data for metal-insulator-semiconductor test structures, where the semiconductor is that in the region of the suspected electrostatic coupling, is not available. If none of these are available for the effective workfunction of the metal/insulator interface, a respected published value can be used, with, if it is available, a model for the Fermi level pinning associated with the insulator (such as described in Y. C. Yeo, et al., "Effect of High-k Dielectrics on the Workfunctions of Metal and Silicon Gates", 2001 *IEEE Symposium on VLSI Technology Tech.Digest,* pp. 49-50 (2001) or Y. C. Yeo, et al., "Effects of high-k Gate Dielectric Materials on Metal and Silicon Gate Workfunctions", *IEEE Elec. Dev. Lett.,* vol. 23, pp. 342-344 (2002)). If such a model is not available for the insulator, experimentally derived pinning parameters associated with $SiO_2$ can be used (see id.). For metal in contact with a semiconductor, whether direct or through an ultra-thin interfacial layer, current-voltage characteristics can be modeled. See, e.g., Section 3.5 of Schroeder, supra.

10. electron: For purposes of this work, "electrons" (or "free electrons") are the quantum states of a negative charge quantum that directly contribute to conductivity of a conductor. See also "hole".

11. electron affinity: the potential associated with the conduction band state(s) of minimum energy of a semiconductor or insulator. See also "ionization potential".

12. field-effect transistor (FET): A device that consists of one or more gates (conventionally one) that modulate the conductivity of one or more channels (conventionally one) to which two or more channel taps (conventionally two) are connected. In an n-channel FET, the channel(s) consist(s) primarily of electrons. In a p-channel FET, the channel(s) consist(s) primarily of holes. In an ambipolar FET, the channel(s) can be either electrons or holes.

13. gate: A FET electrode that controls the charge density in one or more channels.

14. hole: For purposes of this work, "holes" (or "free holes") are the quantum states of a positive charge quantum that contribute to conductivity of a conductor. See also "electron".

15. insulator: A region that in the bulk limit has a negligible conduction of free electrons and/or free holes, for example having a bulk resistivity of comparable to or greater than $10^8$ $\Omega$-$cm^2$. This includes solid, liquid, and gas phase materials, in addition to the absence of significant material (e.g., a vacuum).

16. ionization potential: The potential associated with the valence band state(s) of maximum energy of a semiconductor or insulator. See also "electron affinity".

17. metal channel tap: A channel tap where rectification between the region of the channel and the metal contact is determined primarily by the metal workfunction relative to the potentials of the semiconductor conduction band and/or valence band. If the workfunction is less than the semiconductor electron affinity, or much less than half the semiconductor bandgap greater than the electron affinity, electrons are relatively passed and holes are relatively blocked by the contact, and the contact will be typically suitable for use in an n-channel FET. If the workfunction is much more than half a semiconductor bandgap greater than the semiconductor electron affinity, holes will be generally passed by the contact more readily than electrons, and the contact will be typically suitable for use in p-channel FETs.

18. metal source/drain (S/D) FET: A FET in which the device polarity (n-channel, p-channel, or ambipolar) is determined by whether electrons or holes or both are relatively efficiently transported across metal/semiconductor contacts at the source and drain. For a FET with three or more taps, the taps serving as the source and drain should be of this nature. Variants include asymmetric "metal source" and "metal drain" FETs, in which the source (metal source FET) or drain (metal drain FET) are of this nature.

19. Schottky contact: A direct contact between a metal and a semiconductor.

20. Schottky source/drain (S/D) FET: A metal source/drain FET in which the source and drain consist of direct contacts between metal and semiconductor. Variants include a Schottky source FET and Schottky drain FET. See also "metal source/drain FET".

21. source: A tap to the channel of a field-effect transistor; typically held at a lower potential in the case of an n-channel transistor, or at a higher potential in the case of a p-channel transistor, than the other channel tap(s). It thus acts as the source of carriers that are supplied to the channel when carriers are flowing through the channel.

22. source/drain (S/D): A channel tap.

23. ultra-thin interfacial layer: For purposes of this discussion, when a material between two other materials (effectively at their interface) is said to be "ultra-thin", it implies that the three-material stack exhibits characteristics of an interface between the outer two material types, albeit with characteristics that may differ from those of a direct contact between the two specific outer materials.

24. valence band: in a semiconductor or insulator, a band of states with energy below the Fermi energy of the semiconductor in the absence of impurities in equilibrium. See, also, "conduction band".

From the above, it should be apparent that for field effect transistor applications, especially those of the Schottky source/drain variety, reducing the potential barrier between the conductor and the semiconductor at the source(s) and/or drain(s) region(s) is beneficial to increasing the capacity of current to flow into and out of the channel. As previously demonstrated by Grupp and Connelly, one approach to reducing the Schottky barrier height is, for a metal of appropriate workfunction (relatively low for an n-channel transistor, relatively high for a p-channel transistor), to reduce the magnitude of the charge dipole associated with the metal/semiconductor interaction, where the charge dipole tends to align the Fermi level of the metal with the semiconductor band gap yielding Schottky barriers to both the semiconductor valence band and semiconductor conduction band edges. This is achieved through the use of an interfacial layer between the conductor and the semiconductor at the channel tap—channel interface.

In accordance with the present invention, so that the interfacial layer may be of sufficient thickness to reduce the interaction between the conductor (e.g., a metal) and the semiconductor forming the channel region, yet of sufficient thinness that current can relatively readily penetrate it, for example by quantum mechanical tunneling, a III-VI compound is selected for the interfacial layer when the channel is formed of a Si-based material, or a material of similar crystal structure. One such III-VI compound is GaSe, that has characteristics that make it a suitable interfacial layer especially for p-channel transistors. Other III-VI compounds, whether pure compounds or alloys of pure compounds, may be used and may be more suitable for n-channel transistors. An advantage of GaSe and related materials is the ability to deposit bilayers thereof directly on Si(111), yielding atomic-level control of the overall layer thickness.

The III-VI compounds, consisting primarily of atoms from Groups HA-B and from Group VIA of the Periodic Table of the Elements in an approximate 1:1 ratio, are well suited for use in an insulated gate FET having passivated Schottky barriers to the channel, in which an interface layer made of the III-VI compound is imposed between the channel material and the source/drain material. For example, these materials can form, for the appropriate crystallographic orientation, as layers of covalently bonded element(s) from Groups IIIA-B and covalently bonded Group VIA elements, planes bonded to adjacent planes by Van der Waals forces. This layered structure allows, under appropriate conditions, for the formation of a single bilayer consisting of a single plane of atoms from Groups IIIA-B and a single plane of Group VIA atoms. Thus, under these deposition conditions, virtually "monolayer" thickness control is realized.

Moreover, an interfacial layer composed of such a material has a reduced dipole interaction, relative to the semiconductor forming the channel region (for example, Si), with metals of a workfunction appropriate for the transistor (e.g., a relatively low workfunction for an n-channel transistor, or a relatively high workfunction for a p-channel transistor). Additionally, the interfacial material's interface with the channel region semiconductor has a low defect density, avoiding "extrinsic" states and/or other deleterious effects associated with a high defect density. And, to facilitate the tunneling of free carriers through the interfacial layer, the III-IV compound has sufficiently small potential barriers at the conduction and valence band, combined with suitably low "tunneling effective masses" for electrons and holes.

In one embodiment of the present invention, the III-VI material selected for use as an interfacial layer is GaSe. GaSe has been epitaxially deposited on Si(111). For depositions at temperatures from approximately 500° C. to 600° C., the deposited film consists of a single Ga plane capped with a single Se plane. The Ga plane terminates the bonds of the surface-most Si atoms, inhibiting the 7×7 reconstruction that might otherwise occur. The Se plane then terminates the growth. See, e.g., R. Fritsche et al., *Appl. Phys. Letters*, vol. 80, no. 8, pp. 1388-1390 (2002).

GaSe has been determined, in bulk form, to have a band gap of 2.03 eV. See E. Aulich et al., *Phys. Solid State*, vol. 31, no. 129 (1969). The valence band offsets between the GaSe bilayer and the underlying Si has been measured to be 0.90±0.10 V, H. Reqqass et al., *Appl. Surf. Sci.*, vol. 104-105, p. 557 (1996), and theoretically determined to be 0.98±0.10 V, M. Camara et al., *Phys. Rev. B*, vol. 65, no. 20, p. 205308 (2002). Schottky barriers formed on cleaved GaSe samples yielded Schottky barriers to the GaSe valence band edge ranging from 0.5 V, for Au, to 1.6 V, for Cs. Kurtin et al., *J. Phys. Chem. Solids*, vol 38, pp. 2007-2009 (1969). This range, 1.1 V, is substantially greater than the range of Schottky barriers observed between metals and Si, see, e.g., Mönch, *Physical Review Letters*, vol. 58, no. 12, pp. 1260-1263 (1987), indicating that the dipole response of the surface to the presence of metals of different characteristic workfunction is weaker for GaSe than for Si. Several of these metals (Au, Pd, Pt, Cu, Ag, and Sn) had Schottky barriers to the GaSe no greater than the measured or theoretical values of the valence band offset between a GaSe bilayer and Si{111}. The present inventors thus believe this suggests the possibility of eliminating the Schottky barrier between one or more of these or other metals and the Si{111} valence band edge.

Kurtin et al. measured the tunneling of carrier states through the GaSe band gap. Kurtin et al., *Phys. Rev. Letters*, vol. 25, no. 11, pp. 756-759 (1970). They showed, at 0.9 V from the GaSe valence band edge (approximately the location experimentally determined for the Si valence band edge for GaSe bilayers on Si{111}), the quantum mechanical penetration depth in GaSe is approximately 0.65 nm. This substantially exceeds the GaSe bilayer thickness of approximately 0.34 nm (Fritsche et al., supra), implying an attenuation of the quantum mechanical wavefunction associated with propagating hole states between the Si valence band edge and a surface metal of only approximately 41%. This reduction in current corresponds roughly to an effective Schottky barrier increase close to the "thermal energy", or 25 meV at typical laboratory temperatures. In comparison, the smallest measured Schottky barriers to the Si valence band, of metals in contact with Si, are typically reported to be ten times this magnitude (see, e.g., the case of PtSi, reported by J. Kedzierski et al., 2000 *IEEE IEDM Tech. Digest*, pp. 57-60 (December 2000)). This tunneling probability, given the thickness and height of the assumed potential barrier, corresponds to a tunneling effective mass of 10% the free electron mass.

Thus, the inventors selection of GaSe as an interfacial layer between a metal with a high workfunction and Si{111} to reduce the effective Schottky barrier height between the metal and the Si while still allowing free carriers to tunnel with sufficient probability to substantially increase the amount of current that flows across the junction for a given small potential difference appears to be well supported by the literature. It should be noted that one experiment has been reported (on 15 Jul. 2004) attempting to measure the band offset between Au and Si{111}, with and without a GaSe bilayer. See R. Fritsche et al., *Appl. Surf. Science,* vol. 234, no. 1-4, pp. 321-327 (2004). The authors of that study failed to observe a significant difference in the barrier, attributing the result to a chemical reaction between the Au and the GaSe, destroying the bilayer integrity. While this early result fails to confirm the efficacy of the GaSe bilayer to reduce or eliminate the Schottky barrier between a metal and Si, the conclusion of a chemical reaction for the materials chosen also fails to indicate that the technique lacks general validity.

As discussed earlier, it is sometimes important that the interfacial layer between a source/drain and a channel of a FET allow each carrier type, electrons and holes, to cross it. For example, consider a p-channel FET. Holes must be able to cross, relatively freely, between the source, channel, and drain, when the gate has induced a channel and there is a potential difference, possibly small, between the source and drain. However, various physical processes may result in the generation of a surplus of electron/hole pairs in the region in the vicinity of the channel. If the carrier of the type opposite that of the channel (electrons in the case of a p-channel field-effect transistor) is unable to, with sufficient probability, flow into the source, unless there is a separate contact applied for the removal of these excess carriers they can accumulate and affect the potential in the channel region. This potential shift may result in a corresponding change in the density of channel carriers, changing the device current. This is an example of a "history effect" that can cause deleterious effects on circuit operation, where the current depends not only on the potentials that occurred in time scales short in comparison to circuit switching times, but additionally on phenomena occurring over longer time scales. Thus, allowing the transport of both electrons and holes is preferred.

Given a GaSe band gap of 2.03 V (see Aulich, supra), a Si band gap of 1.12 V (see Sze, *Physics of Semiconductor Devices,* Second Edition, Wiley (1981)), and a valence band offset between a GaSe bilayer and Si(111) on which it is epitaxially formed of near 0.90 V (Raqqass, et al., supra) or near 0.98 V (Camara, et al., supra), the conduction band offset between a GaSe bilayer and Si(111) on which it is epitaxially formed is relatively small: approximately 0.0 V or 0.1 V. It is uncertain, however, that the value of the GaSe band gap extracted from bulk samples applies to GaSe bilayers. Nevertheless, it appears the conduction band offset is small in comparison to the valence band offset, implying a high probability for electron states to cross between the Si conduction band and a metal at the opposite GaSe surface.

Figure 1A:
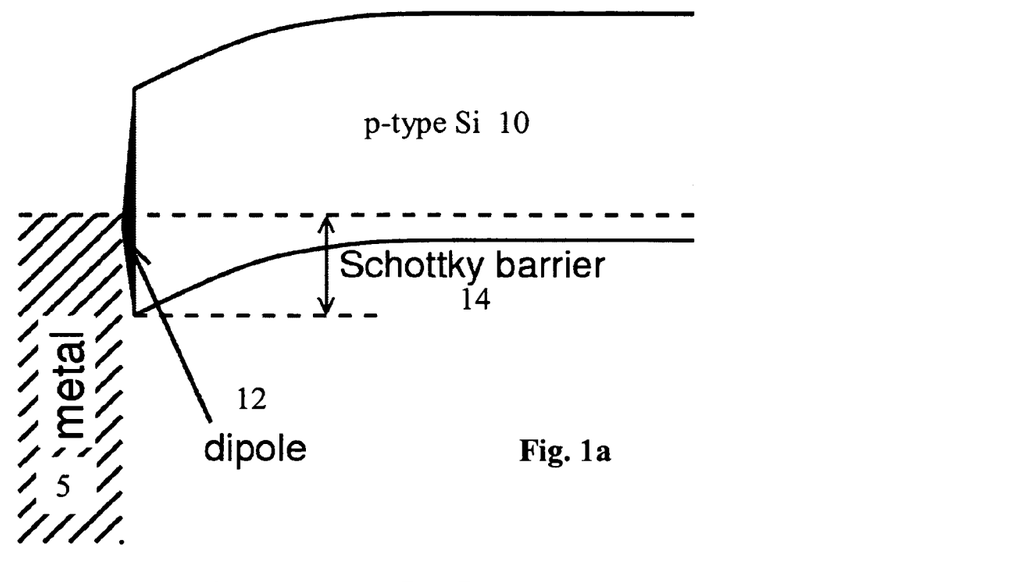
FIGS. 1a and 1b illustrate, respectively, energy band alignments of metal/Si {111} junctions with and without interfacial GaSe bilayers to highlight advantages achieved through the use of such bilayers in accordance with embodiments of the present invention.
Figure 1B:
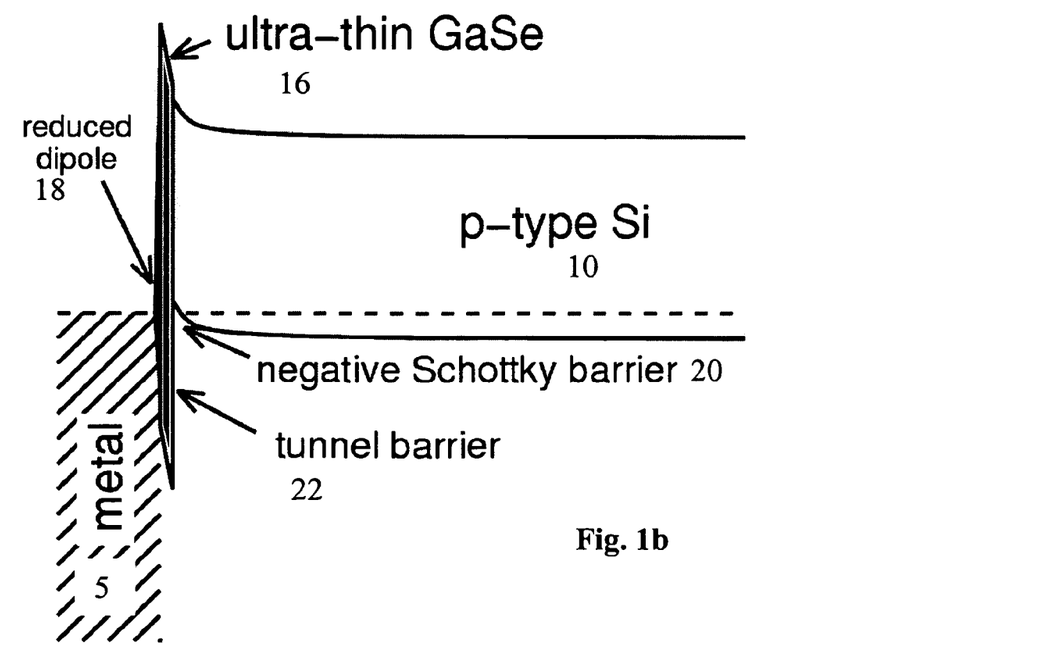

A schematic representation of the anticipated effect of an interfacial GaSe bilayer on the band alignment of a metal/p-type silicon junction, for a metal with a workfunction in excess of the ionization potential of silicon, is shown in FIG. 1b. First, FIG 1a shows the band alignment when the metal 5 is in direct contact with the Si 10. Notice the large charge dipole 12 near the interface. This charge results in a band alignment with a substantial Schottky barrier 14 between the metal 5 and the Si valence band edge. In FIG. 1b, a GaSe bilayer 16 is between the metal 5 and the Si 10. The strength of the induced charge dipole 18 is reduced, due to the relative characteristics of GaSe and Si. The Schottky barrier 20 between the metal and the Si valence band is now gone.

On the other hand, there is now a "tunneling barrier" 22 associated with the GaSe valence band. However, given the extreme thinness of the GaSe bilayer 16, this tunneling probability is sufficiently large that the reduction in the Schottky barrier height more than compensates a loss in hole current from the tunneling.

Liao et al. U.S. published patent application no. 2004/0061132 describes the use of III-VI materials, with the specific example of InSe, on Si, as a "wide band gap" emitter for a bipolar junction transistor. While this is similar to the present invention in that it uses a material of the same class for a connection to a node of a Si-based transistor, the specific application is quite different, as it is the direct utilization of the wider band gap of a relatively thick (for example, from Table I of the Liao application, 100 nm) III-VI compound, rather than the effect of an ultra-thin (e.g., less than 1 nm for a bilayer of GaSe on Si {111}) III-VI layer on the interaction of a metal with a separate semiconductor.

Turning now to FIGS. 2a-2d, illustrated are various cross-sections of a transistor 24 fabricated in accordance with an embodiment of the present invention. The specific example shown in these illustrations is a p-channel Schottky source/drain, fully depleted silicon-on-insulator single-gate insulated gate field-effect transistor with a Si(001) channel and a GaSe bilayer on etch-exposed Si{111} at the source and drain. None of the specific features of this device in any way imply the inapplicability of the invention to alternate device types. For example, although the illustrated device is a p-channel transistor, the present invention applies also to n-channel and ambipolar transistors. Moreover, the present invention also applies to doped source/drain field-effect transistors and/or to partially-depleted silicon-on-insulator, bulk silicon, and non-silicon-based transistors either "on insulator" or bulk. Likewise, the present invention is applicable to "multi-gate" (for example, dual-gate) and "non-planar channel" (for example, FinFETs, Omega FETs, Tri-gate FETs, cylindrical gate, and gate-all-around FETs) designs, and to Schottky gate and junction gate designs (such as MODFETs, JFETs, and MESFETs).

The illustrations show the channel on a {001} surface. However, other surface orientations are possible. Likewise, although the illustrated source and drain are on etch-exposed {111} surfaces, other source and/or drain surface orientations are also possible. Additionally, the {111} source and/or drain surfaces may be exposed by techniques other than etching, such as forming the channel on Si{111} through the suitable choice of starting material such that the channel is also formed on a {111} surface. In some cases the transistor could have more than a single source or more than a single drain (multi-tap designs), or could have a source without a drain (a MOS capacitor). In the example discussed below the source, drain, and gate are independently connected, however, in other implementations the gate could also be directly connected to the drain, yielding a "diode-connected FET". Additionally, material in the channel is here generally all of the same crystallographic orientation, although the present invention also applies to devices formed with amorphous and/or polycrystalline semiconductor materials.

In discussing the present method to fabricate transistor 24 many details not critical to an understanding of the present invention have been omitted. It is believed that such matters are within the routine knowledge of those of ordinary skill in the art of semiconductor device design and processing. Furthermore, processes required to couple transistor 24 to other elements in order to create various circuits have not been described inasmuch as such details are not particularly relevant to the present invention.

Figure 2A:
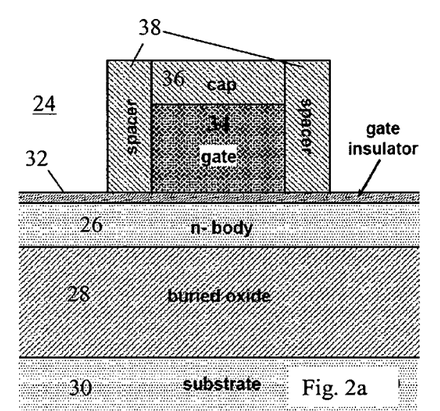
FIG. 2a-2d illustrate various cross-sectional views of a p-channel silicon-on-insulator field effect transistor undergoing fabrication to include GaSe bilayers at source/drain—channel interfaces in accordance with an embodiment of the present invention.

As shown, transistor 24 is fabricated on a thin (001) lightly doped (indicated by "n–") silicon-on-insulator (SOI) layer 26. This layer 26 is disposed over an oxide layer 28 that itself is disposed over a substrate 30. Semiconductor wafers of this type are generally available commercially. The semiconductor may be any of: Si, Ge, C; an alloy of Ge and Si; an alloy of Si and C; an alloy of Ge and C; or an alloy of Ge, Si, and C. The semiconductor may be strained or unstrained. An example of a strained semiconductor is Si under tensile or compressive strain for the purpose of electron and/or hole mobility enhancement.

Initially, a gate insulator 32 is formed over the SOI wafer and a gate conductor 34 (e.g., doped polycrystalline silicon, or a tunable-workfunction metal) deposited thereover. The precise nature of the gate electrode is not critical to the present invention and its fabrication may be carried out in any conventional fashion. For example, the gate 34 may be capped, e.g., with a $Si_3N_4$ cap 36, that is then patterned and etched with a gate mask. Once the photoresist used for this process has been removed, the underlying gate conductor 34 may be etched and spacers (for example, made of $Si_3N_4$, $SiO_2$, or a combination thereof) 38 formed on the side of the gate 34. FIG. 2a shows the resulting structure.

Figure 2B:
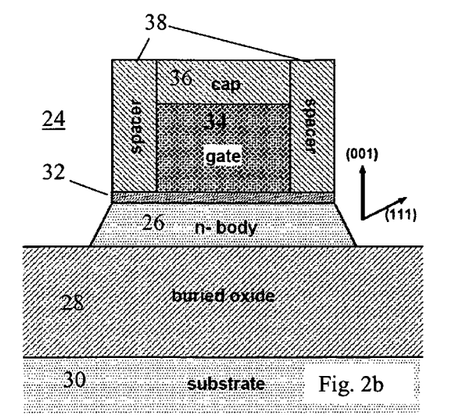

At this stage, as shown in FIG. 2b, the Si surface 26 may be exposed, if necessary, and the Si etched in tetramethylammonium hydroxide (TMAH), exposing {111} surfaces. Alternatively, the Si{111} surfaces may be exposed using a KOH solution in water, or a solution of 35% (molar) ethylenediamine (1,2-diaminoethane hydrate) $NH_2$ $(CH_2.CH_2)NH_2$, and 3.7% (molar) pyrocatechol (o-dihydroxybenzene) $C_6H_4(OH)_2$ in 61% (molar) water at a temperature of 100° C. may be used (see Finne & Kleine, *J. Electrochem. Soc*, v. 122, p. 545 (1967)). Other etchants may also be used.

Figure 2C:
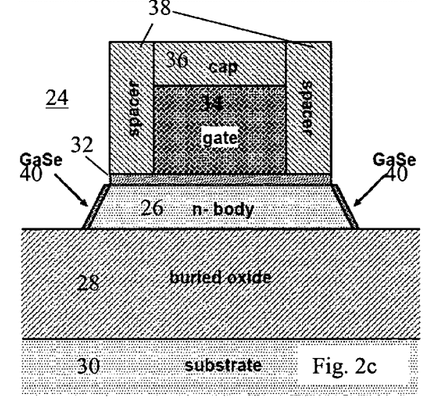
Figure 2D:
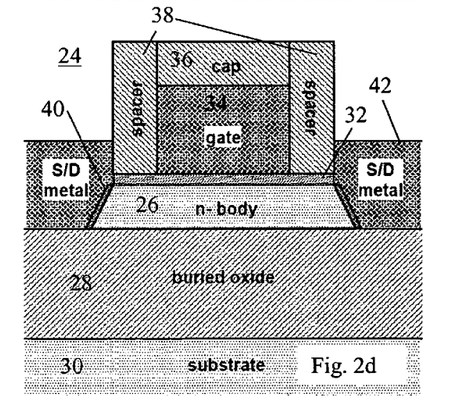

Once the Si(111) surfaces have been exposed, the wafer is annealed at a temperature sufficient, in an atmosphere of sufficiently low partial pressures of oxygen and other gasses, to generate a 7×7 reconstruction of the {111} surfaces. Others have used a 500° C. anneal followed by 875° C. "flash" anneal to accomplish such reconstruction (see, e.g., S Meng et al., *Phys. Rev. B*, vol. 61, no. 11, pp. 7215-7218 (2000)). Immediately following this reconstruction, and without exposing the wafers to atmosphere, the GaSe bilayer 40 is deposited or grown as illustrated in FIG. 2c. This process will provide an interfacial III-VI layered compound that is approximately epitaxially aligned with the underlying {111} semiconductor. In one embodiment, the interfacial III-VI layered compound comprises primarily a bilayer made up of a single plane of primarily elements from Groups IIIA-B and a single plane of primarily Group VIA elements.

Following the deposition of the interfacial layer, the first layer of the source/drain metal stack 42 may then be deposited, preferably in-situ. This could be, for example, a thin layer of a high-workfunction metal such as Pt, fr, or Pd. A capping metal such as W or Ti can be used over the high-workfunction metal; the effective workfunction of the junction is determined by only the first few monolayers of metal at the surface. In some cases, the metal has a workfunction, associated with one or more surfaces, of greater than the ionization potential (the potential associated with the point of maximum energy in the valence bands) of the semiconductor channel in a vicinity of the channel tap. This is a preferred embodiment for some p-channel FETs. In other cases, the metal has a workfunction, associated with one or more surfaces, less than the electron affinity (the potential associated with the point of minimum energy in the conduction bands) of the semiconductor channel in the vicinity of the channel tap. This is a preferred embodiment for some n-channel FETs. The metal may be polished back to the level of the gate cap and then etched a fixed distance below the gate cap to produce the final structure shown in FIG. 2d. This may, for example, increase the switching speed of circuits due to a reduction in the total charge required to establish a fixed change in potential between a transistor gate and source, or between a transistor gate and drain.

Thus, a transistor having one or more channel taps containing a stack consisting at least in part of a semiconductor an interfacial III-VI layered compound and a conductor has been described. Although discussed with reference to various illustrated embodiments, it should be remembered that the present invention is not meant to be limited thereby and should only be measured in terms of the following claims.

What is claimed is:

1. A transistor, comprising a gate, a semiconductor channel formed on an {001} surface, and one or more channel taps, at least one of the channel taps arranged as a stack on a {111} surface of the semiconductor channel and consisting at least in part of the semiconductor channel, an interfacial III-VI layered compound consisting of one or more elements from Groups IIIA-B and one or more Group VIA elements in approximately a 1:1 ratio of Groups IIIA-B to Group VIA stoichiometry, and a conductor, wherein the interfacial III-VI layered compound (i) comprises primarily a bilayer made up of a single plane of primarily elements from Groups IIIA-B and a single plane of primarily Group VIA elements, and (ii) is approximately epitaxially aligned with the underlying {111} surface of the semiconductor channel.

2. The transistor of claim 1, wherein the interfacial III-VI layered compound comprises primarily GaSe.

3. The transistor of claim 1, wherein the conductor comprises a metal.

4. The transistor of claim 3, wherein the interfacial III-VI layered compound comprises primarily GaSe.

5. The transistor of claim 3, wherein the metal has a workfunction, associated with one or more surfaces, of greater than an ionization potential of the semiconductor channel in a vicinity of the channel tap.

6. The transistor of claim 5, wherein the interfacial III-VI layered compound comprises primarily GaSe.

7. The transistor of claim 3, wherein the metal has a workfunction, associated with one or more surfaces, less than an electron affinity of the semiconductor channel in a vicinity of the channel tap.

8. The transistor of claim 7, wherein the interfacial III-VI layered compound comprises primarily GaSe.

9. A transistor, comprising a gate, a semiconductor channel formed on an {001} surface, and one or more channel taps, at least one of the channel taps arranged as a stack on a {111} surface of the semiconductor channel and consisting at least in part of the semiconductor channel, an interfacial III-VI layered compound consisting of one or more elements from Groups IIIA-B and one or more Group VIA elements in approximately a 1:1 ratio of Groups IIIA-B to Group VIA stoichiometry, and a conductor, wherein the interfacial III-VI layered compound comprises primarily GaSe.

10. The transistor of claim 9, wherein the semiconductor channel comprises, in any strain state, one of: Si, Ge, C; an alloy of Ge and Si; an alloy of Si and C; an alloy of Ge and C; or an alloy of Ge, Si, and C.

11. The transistor of claim 10, the conductor comprises a metal.

12. The transistor of claim 11, wherein the metal has a workfunction, associated with one or more surfaces, of greater than an ionization potential of the semiconductor channel in a vicinity of the channel tap.

13. The transistor of claim 11, wherein the metal has a workfunction, associated with one or more surfaces, less than an electron affinity of the semiconductor channel in a vicinity of the channel tap.

14. The transistor of claim 9, wherein the conductor comprises a metal.

15. The transistor of claim 14, wherein the interfacial III-VI layered compound comprises primarily a bilayer made up of a single plane of primarily elements from Groups IIIA-B and a single plane of primarily Group VIA elements.

16. The transistor of claim 14, wherein the metal has a workfunction, associated with one or more surfaces, less than an electron affinity of the semiconductor channel in a vicinity of the channel tap.

17. The transistor of claim 16, wherein the interfacial III-VI layered compound comprises primarily a bilayer made up of a single plane of primarily elements from Groups IIIA-B and a single plane of primarily Group VIA elements.

18. The transistor of claim 14, the metal has a workfunction, associated with one or more surfaces, of greater than an ionization potential of the semiconductor channel in a vicinity of the channel tap.

19. The transistor of claim 18, wherein the interfacial III-VI layered compound comprises primarily a bilayer made up of a single plane of primarily elements from Groups IIIA-B and a single plane of primarily Group VIA elements.

* * * * *